United States Patent
Servos et al.

(10) Patent No.: US 10,512,954 B2
(45) Date of Patent: Dec. 24, 2019

(54) METHOD TO PREVENT GROUNDING FROM A SILICON ROD TO A PLATE IN POLYCRYSTALLINE SILICON REACTOR

(71) Applicants: Mitsubishi Polycrystalline Silicon America Corporation (MIPSA), Theodore, AL (US); MITSUBISHI MATERIALS CORPORATION, Tokyo (JP)

(72) Inventors: Mark Servos, Theodore, AL (US); Steve Varnes, Theodore, AL (US); Matthias Colomb, Theodore, AL (US)

(73) Assignees: Mitsubishi Polycrystalline Silicon America Corporation (MIPSA), Theodore, AL (US); MITSUBISHI MATERIALS CORPORATION, Tokyo (JP)

( * ) Notice: Subject to any disclaimer, the term of this patent is extended or adjusted under 35 U.S.C. 154(b) by 58 days.

(21) Appl. No.: 15/969,243

(22) Filed: May 2, 2018

(65) Prior Publication Data
US 2019/0337030 A1    Nov. 7, 2019

(51) Int. Cl.
*B08B 9/08* (2006.01)
*C01B 33/035* (2006.01)

(52) U.S. Cl.
CPC ............ *B08B 9/08* (2013.01); *B08B 2220/04* (2013.01); *C01B 33/035* (2013.01)

(58) Field of Classification Search
None
See application file for complete search history.

(56) References Cited

U.S. PATENT DOCUMENTS

| | | | |
|---|---|---|---|
| 6,279,402 B1* | 8/2001 | Fisher | C23C 16/45557 73/754 |
| 9,231,111 B2* | 1/2016 | Yamazaki | H01L 29/7869 |
| 2009/0280649 A1* | 11/2009 | Mayer | B23H 5/08 438/676 |
| 2017/0070180 A1* | 3/2017 | Mills | H05H 1/48 |

* cited by examiner

*Primary Examiner* — Eric W Golightly
(74) *Attorney, Agent, or Firm* — Locke Lord LLP

(57) ABSTRACT

A method to prevent groundings of polycrystalline silicon rod holders to a reactor plate by the residual polymer in the following manner: first, providing a polycrystalline silicon reactor having a reactor plate with a plurality of silicon rod holders separated from the reactor plate with an insulation; next establishing an electrical circuit from a ground connection on the reactor plate connected to high potential test equipment to a high voltage probe; and finally completing the electrical circuit by contacting the high voltage probe to the holder. By this method any remaining polymer is physically removed as the polymer burns or is ejected by the energetic release caused by mild arcing from the holder to the reactor plate.

5 Claims, 2 Drawing Sheets

METHOD TO PREVENT GROUNDING FROM A SILICON ROD TO A PLATE IN POLYCRYSTALLINE SILICON REACTOR

BACKGROUND OF THE INVENTION

1. Field of the Invention

The present invention relates to a method to prevent groundings of polycrystalline silicon rod holders to a ground plate by a residual polymer produced in the formation of polycrystalline silicon.

2. Description of Related Art

The Siemens method is known as a method of producing high-purity polycrystalline silicon to be used as a semiconductor material. This Siemens method is a production method of bringing a source gas composed of a mixed gas of chlorosilanes and hydrogen into contact with a heated silicon seed rod, and depositing the polycrystalline silicon on the surface of the seed rod by reaction of the source gas. As an apparatus which carries out this production method, a polycrystalline silicon reactor in which many silicon seed rods are stood is used. Generally, the silicon seed rods are connected by a connecting member at upper ends thereof to form in a n-shape, and both lower ends thereof are fixed to electrodes which are installed at a plate at the bottom of the reactor.

Thus, an electric current is applied to the whole silicon seed rods from the electrodes located at both ends, and the whole silicon seed rods are heated to about 1050° C. to 1100° C. which is the thermal decomposing temperature of the source gas by Joule's heat by the electric current. The source gas supplied into the reactor contacts the surfaces of the silicon seed rods heated in this way, and is thermally decomposed or hydrogen-reduced, whereby polycrystalline silicon is deposited on the surfaces of the silicon seed rods. As this reaction proceeds continuously, rod-like polycrystalline silicon grows into large, thick rods.

Meanwhile, in the process during which a source gas of chlorosilanes, such as trichlorosilane, reacts within the reactor, and polycrystalline silicon deposits on the surfaces of the silicon seed rods, the deposition process also produces silicon powders and polymer compounds. The polymer compounds are cooled, and thus precipitated on the inner circumferential surfaces of the deposition reactor, as well as in the piping leading to the exhaust gas treatment section of the process.

After the reaction and after the rods are harvested by being removed from the reactor, the reactor must be thoroughly cleaned. Cleaning of the surfaces where the rod holders are in closest proximity to the reactor plate is difficult because of mechanical interferences. The residual polymer, that could not be effectively cleaned, in these areas has caused rod holders to ground to the plate during reactor start-up when voltage potential in the circuit is at its highest level.

The cause of the groundings were previously unknown as the gap between holder and plate should have been sufficient for a higher potential voltage source. Determining that the cause of the grounding was polymer deposited in the area where the rod holders are in close proximity to the reactor plate presented a challenge. In addition, determining a method to clean the hard to reach areas while maintaining low reactor contamination and high product purity was another challenge.

BRIEF SUMMARY OF THE INVENTION

The invention was made in view of such problems, and an object of the invention is to provide a method to prevent groundings of the polycrystalline silicon rod holders to the ground plate by the residual or remaining polymer.

In order to solve the above problems, the method employs the following steps:
providing a polycrystalline silicon reactor having a reactor plate with a plurality of silicon rod holders each separated from the reactor plate with an insulation;
establishing an electrical circuit from a ground connection on the reactor plate connected to a high potential test equipment further connected to a high voltage probe; and
completing the electrical circuit by contacting the high voltage probe to the holder;
wherein any remaining polymer is physically removed as the polymer burns or is ejected by the energetic release caused by mild arcing from the holder to the reactor plate.

Further in order to solve the above problem by a different process, the method employs the following steps:
providing a polycrystalline silicon reactor having a reactor plate with a plurality of silicon rod holders each separated from the reactor plate with an insulation;
establishing an electrical circuit from the holder connected to a high voltage switching component further connected to an automated alternating current high potential testing equipment further connected to a ground connection; and
completing the electrical circuit by applying the voltage so that a current flows from the automated alternating current high potential testing equipment to the ground connection;
wherein any remaining polymer is physically removed as the polymer burns or is ejected by the energetic release caused by mild arcing from the holder to the reactor plate.

DETAILED DESCRIPTION OF THE INVENTION

Figure 1:
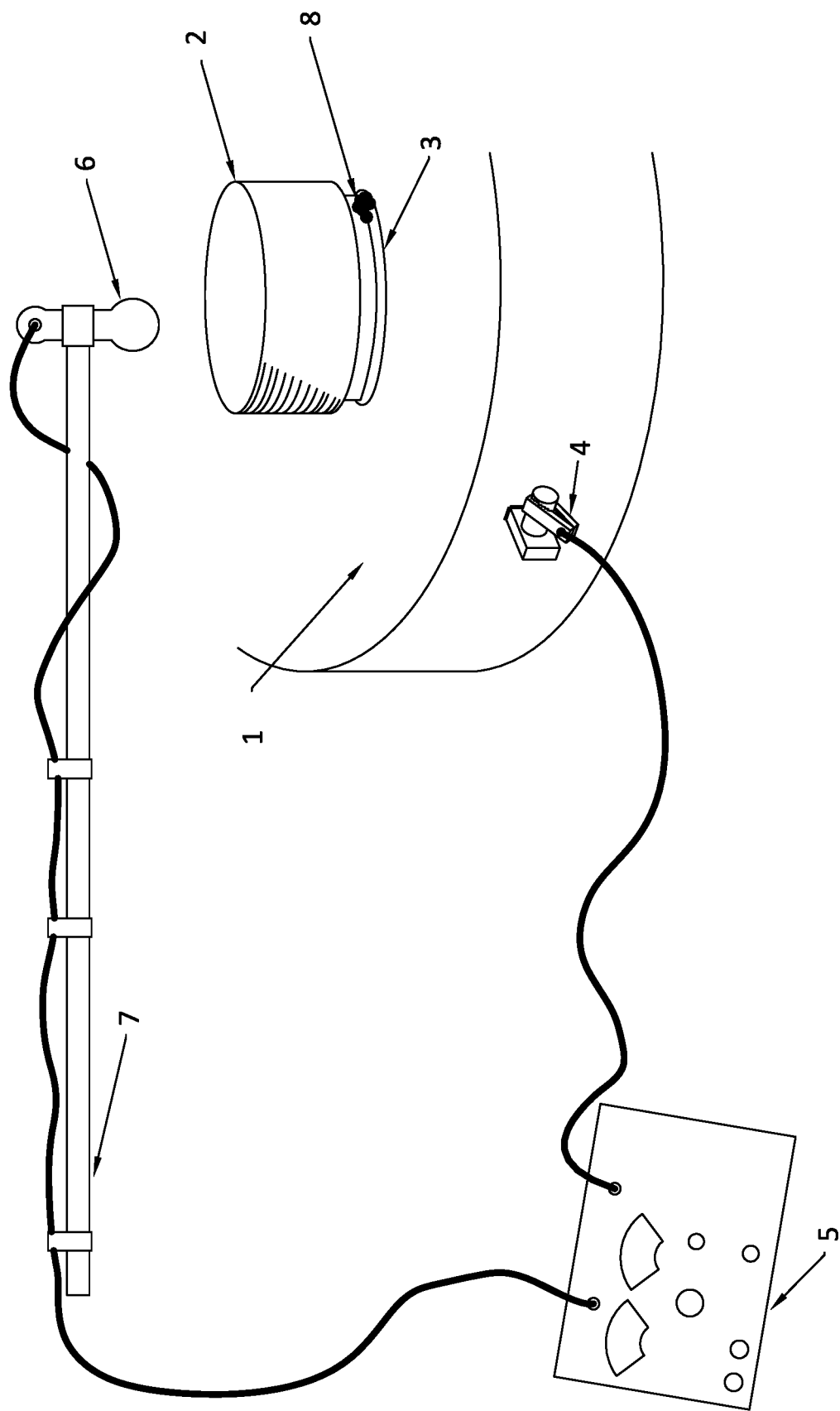
FIG. 1 is a first embodiment of a reactor on which the method of the invention is performed.

A manufacturing device employing the Siemens method is known as a polycrystalline silicon manufacturing device. In the polycrystalline silicon manufacturing device, a plurality of silicon seed rods are arranged in a reacting furnace or reactor. The polycrystalline silicon reactor is a reactor which applies an electric current to silicon seed rods provided within the reactor, thereby heating the silicon seed rods, brings a source gas supplied into the reactor into the reaction, and deposits polycrystalline silicon on the surface of the silicon seed rods. The reactor includes, a bottom plate on the bottom of the furnace or reactor, a plurality of electrode holders which are provided so as to be electrically insulated from the bottom plate, and a plurality of seed rod holding electrodes which are connected to the electrode holders and hold the silicon seed rods upward.

The silicon seed rods in the reacting furnace are heated and raw material gas including mixed gas of chlorosilane gas and hydrogen gas is supplied to the reacting furnace to come into contact with the heated silicon seed rods. On a surface of a silicon seed rod, polycrystalline silicon produced by a hydrogen reduction reaction and a thermal decomposition reaction of the raw material gas represented by the following reaction formulas (1) and (2) is precipitated.

$$SiHCl_3 + H_2 \rightarrow Si + 3HCl \tag{1}$$

$$4SiHCl_3 \rightarrow Si + 3SiCl_4 + 2H_2 \tag{2}$$

However, in exhaust gas produced by the reactions, silicon tetrachloride which is a by-product, unreacted chlorosilane gas, silicon powders, polymer compounds including $Si_2Cl_6$, $Si_2H_2Cl_4$ and the like, hydrogen gas and hydrogen chloride gas are included. Among them, the polymer compounds are cooled in exhaust gas piping and the reacting furnace having a jacket structure and are thus precipitated on inner circumferential surfaces of the piping and the reacting furnace.

The silicon rods are heated by means of an electrical current passing through the rods and rod holders in a resistive circuit. The growing rods themselves and the metal holders that support them are part of the electrical circuit. The reactor plate is in an electrically grounded state. The rod holders are prevented from grounding to the plate by means of an electrical insulator (usually polytetrafluoroethylene) on the holder surface. During the reaction, a viscous liquid polymer is deposited on the holders and reactor plate. The polymer is a weak electrical conductor; however, it is more conductive than polytetrafluoroethylene. Holder groundings to the plate do not typically occur during later stages of the reaction because the voltage applied to the circuit drops during the course of the reaction.

After the reaction and after the rods are harvested, the reactor is thoroughly cleaned. Cleaning of the surface where the rod holders are in closest proximity to the reactor plate is difficult because of mechanical interferences. The remaining or residual polymer, that could not be effectively cleaned, in this area has caused rod holders to ground to the plate during reactor start-up when voltage potential in the circuit is at its highest level.

Hereinafter, an embodiment of a method to prevent grounding from rod to plate in a polysilicon reactor according to the present invention will be described with reference to the drawings.

FIG. 1 is an embodiment the apparatus for manufacturing polycrystalline silicon which is applicable to the present invention. A reactor of the apparatus for manufacturing polycrystalline silicon is provided with a reactor plate 1 which constructs the reactor floor, and a bell-shaped bell jar (not shown) which is detachably attached on the reactor plate 1. An upper surface of the reactor plate 1 is formed as substantially a flat horizontal plane. The bell jar has a hanging-bell shape, in which an inner space thereof is the highest at the center and the lowest at the outer peripheral portion. The walls of the reactor plate 1 and the bell jar construct a jacket structure (the illustration is omitted) and are cooled by coolant water.

The reactor plate 1 is provided with a plurality of electrode units in which silicon seed rods for polycrystalline silicon are attached to, a plurality of ejection nozzles (i.e., gas supply ports) ejecting raw-material gas including chlorosilane gas and hydrogen gas into the reactor, and a plurality of gas discharge ports discharging gas after reaction to the outside of the reactor.

The ejection nozzles of raw-material gas are arranged across the upper surface of the reactor plate 1 of the reactor with appropriate intervals there between so as to supply raw-material gas evenly to each of the silicon seed rods. The ejection nozzles are connected to a raw-material gas supply source which is located the outside of the reactor. The gas discharge ports are formed with appropriate intervals along the circumferential direction in the vicinity of the outer peripheral portion on the reactor plate 1, and are connected to an exhaust gas treatment system which is located the outside of the reactor. The electrode units are connected with a power circuit.

Each of the silicon seed rods is fixed with the lower end of the silicon seed rod being inserted into the electrode unit, and stands upward. A connecting member connecting two silicon seed rods as a pair is attached on the top end of each of the silicon seed rods. Two cylindrical through-holes are formed at both ends of the connecting member, and engaged to columnar boss portions which are formed at the top ends of the silicon seed rods. The connecting members are made of silicon as same as the silicon seed rods. A seed assembly having n-shape is constructed from two silicon seed rods and the connecting member connecting the silicon seed rods. The seed assemblies are arranged in substantially a concentric pattern since the electrode holders are arranged in a concentric pattern with respect to the center of the reactor.

More specifically for the electrode units, electrode units holding one silicon seed rod and electrode units holding two silicon seed rods are arranged in the reactor. The plurality of seed assemblies are provided so as to connect between the electrode units. The electrode units are lined so that one electrode unit, the plurality of electrode units, and one electrode unit are in series, and connect the plurality of the seed assemblies in series. That is, one of the silicon seed rods of one seed assembly is held by one of the electrode units; and the other of the silicon seed rods of the seed assembly is held by the adjacent another electrode unit.

That is, the electrode unit holds one of the two silicon seed rods of one seed assembly, and each of the electrode units holds one silicon seed rod of two pair of the seed assembly. The electrode units and the seed assemblies are constructed so as to be supplied electricity via cables connected to the electrode units at the both end of the series.

In the apparatus for manufacturing polycrystalline silicon constructed above, by supplying electricity via the electrode units to the silicon seed rods, the silicon seed rods are heated by electrical resistance. Further, the silicon seed rods are heated by the radiation heat of the adjacent silicon seed rods each other. Then, polycrystalline silicon is deposited by the reaction of the raw-material gas on the surface of the silicon seed rods which are heated by Joule heat synergistically with the radiation heat.

The structure of the electrode units for holding the silicon seed rods will be described.

The electrode unit has a holder portion, or holder 2, which is inserted in a through-hole formed at the reactor plate 1 of the reactor, and a seed rod holding portion, or electrode, holding the silicon seed rod (not shown) that is fixed to the upper portion of the holder portion. The seed rod holder members are substantially columnar members having holding holes in which the silicon seed rods are inserted are formed on the top end thereof, and helical threads are formed on the outer peripheral surfaces thereof. The seed rod holding members and the holder portion are made of conductive material (e.g., carbon). The holders 2 are made of conductive material (e.g., stainless steel). An internal screw hole which engages with the seed rod holding member is formed on the upper portion of the holder portion. An internal screw hole which engages with the seed rod holding member is formed on the upper portion of the holder 2. Nuts are threaded with the seed rod holding member which engage with the internal screw holes.

Furthermore, in the electrode unit, the holding structure of the seed rod holding member is not limited as the above embodiment in which the seed rod holding member is held by being screwed into the internal screw hole of the holder portion and the nut is attached.

As shown in FIG. 1, on the reactor plate 1, a plurality of holders 2 to which silicon seed rods to be seeds for generating polycrystalline silicon rod are mounted, injection nozzles which inject raw gas including chlorosilanes and hydrogen into the reactor, and gas exhaust ports which discharge reacted gas to the outside of the reactor are provided.

The holders 2 are formed to have substantially a columnar shape, mounted substantially concentrically on the reactor plate 1 with a regular intervals, stand perpendicularly to the reactor plate 1, and hold the silicon seed rods. The holders 2 are connected to an external power supply equipment of the reactor (not illustrated), and supply the power to the silicon seed rods.

At a center part of the reactor plate 1, a heater (not shown) made from carbon is mounted on the holder 2 on the reactor plate 1 in a similar manner to the silicon seed rods. The heater heats the silicon seed rods in the vicinity of the center by radiation at the beginning of an operation.

An arrangement and a number of the silicon seed rods, and a position and a number of the injection nozzles and the gas exhaust ports can be appropriately set according to size of the reactor plate 1 or the like.

Figure 2:
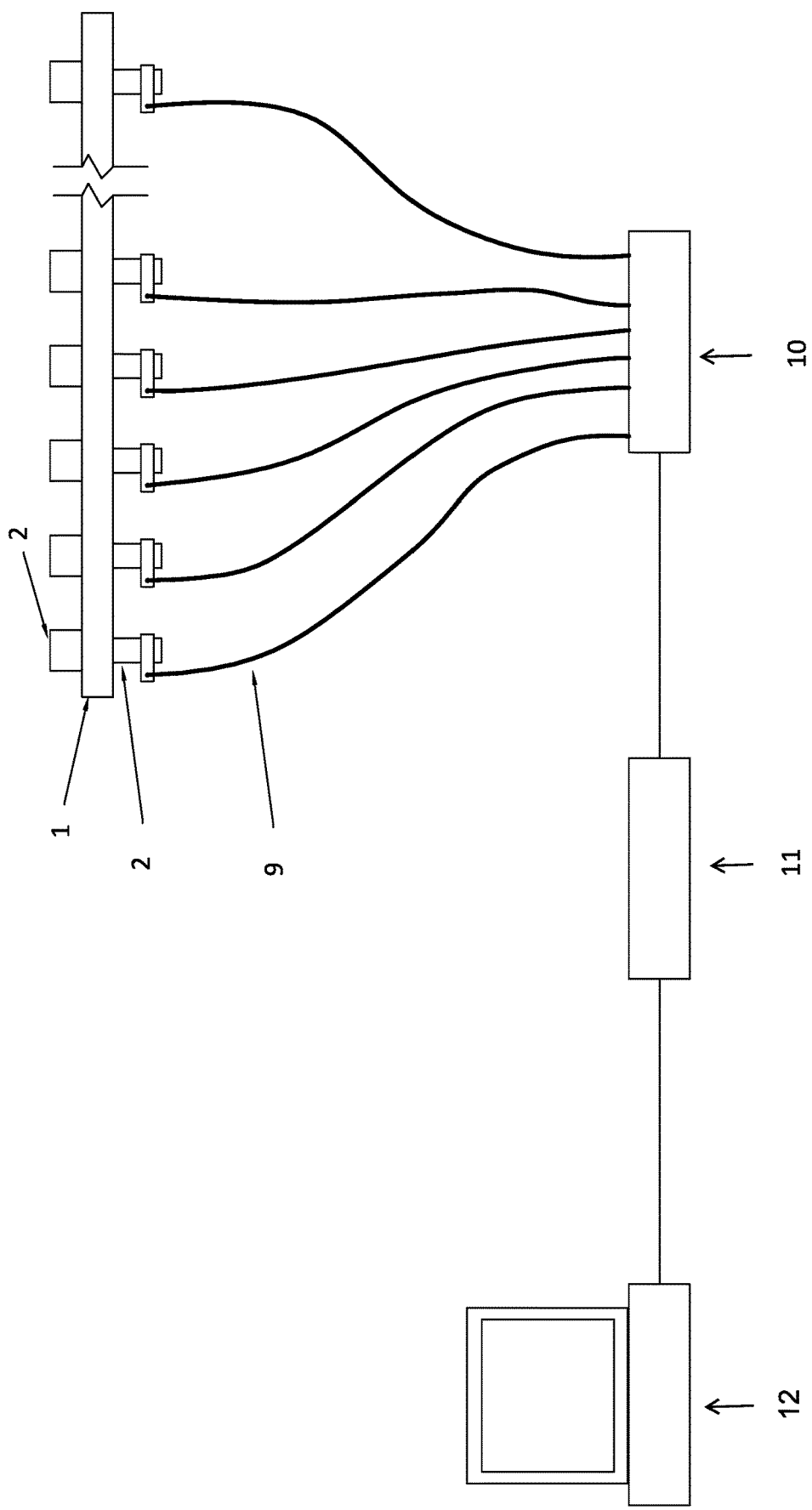
FIG. 2 is a second embodiment of a reactor on which the method of the invention is performed.

As shown in FIG. 2, each holder 2 has a portion above reactor plate 1 and portion below reactor plate 1. The holder 2 has a substantially columnar shape made of a corrosion-resistant material such as a stainless, hastelloy (registered trademark), and is disposed so as to pass through the reactor plate 1 of the polycrystalline silicon reactor. Each holder 2 has an electric current directly applied from a power source below (not shown).

The columnar portion of the holder 2 above the reactor plate 1 is separated from the reactor plate 1 by an insulation 3. The insulation 3 can be an electrical insulator like Teflon or polytetrafluoroethylene. The insulation 3 is provided so as to fit to the outer peripheral surface of holder 2 and an inner wall of a through hole of reactor plate 1.

FIG. 2 shows holder 2 with a portion of holder 2 above reactor plate 1 and portion of holder 2 below reactor plate 1. The portion of holder 2 above reactor plate 1 has a larger diameter than the portion of holder 2 below reactor plate 1. Furthermore, as shown in FIG. 1, the portion of holder 2 above the reactor plate 1 having a larger diameter is raised above reactor plate 1 and formed with an overhang portion. The overhang portion creates a space or gap between the holder 2 and reactor plate 1. Directly below the overhang portion is a portion of holder 2 with a narrower diameter which is separated from the reactor plate 1 by insulation 3.

Holder 2 can be a single silicon rod holder 2 as shown in FIGS. 1 and 2 or a double holder type which supports two silicon seed rods. Such double holder is made of a corrosion-resistant material such as a stainless, hastelloy (registered trademark), has a portion which extends in a vertical direction, and a supporting portion which extends horizontally of the vertical portion at an upper end of the vertical portion, and is T-shaped in side view as a whole. The insulation arrangement surrounding the double holder in the through hole in the reactor plate 1 is in the same configuration as for the single holder 2 shown in FIG. 1.

The invention is not limited to the embodiments, and various modifications can be made without departing from the spirit and scope of the invention.

It is critical when operating the reactor to prevent groundings from the holder 2 to the reactor plate 1 by means of an applied voltage before the polysilicon seeds are assembled for the following reactor run. The process performed on the first embodiment of a reactor is exemplified in FIG. 1. First a ground connection 4 is made to the reactor plate 1. Next the ground connection 4 is connected to a high potential testing equipment 5. The high potential testing equipment 5 is further connected to a high voltage probe 6. The high voltage probe 6 can take on any form, for example, can be placed on an insulated extension pole 7 if additional length is needed.

Once the ground connection 4, connected to the high potential test equipment 5 and further connected to the high voltage probe 6 is established, the reactor cleaning method can be started. First the high potential test equipment 5 is turned on. Next the high potential test equipment 5 is set in the range of about 5 to 30 milliamperes and about 1,500 to 4,000 volts. The high potential test equipment can be set at about 5, 10, 15, 20, 15 or 30 milliamperes and about 1,500; 2,000; 2,500; 3,000; 3,500; or 4,000 volts. As an example the high potential test equipment 5 can be set to about 15 milliamperes and about 2,500 volts.

Next, for example, a hot side voltage is placed on each holder 2 with voltage applied at 2,500 V for thirty seconds with current limited to 15 milliamperes. The voltage is placed on each holder by touching the high voltage probe 6 to each holder 2. Once the high voltage probe 6 touches the holder 2 a complete electrical circuit is created from the ground connection 4 on reaction plate 1 connected to the high potential test equipment 5 further connected to high voltage probe 6 further touching the holder 2 and finally connected to the reactor plate 1. In this example, current is limited to 15 milliamperes to prevent arcing damage to the plate in the form of pitting. This limit is not meant to be absolute, and one skilled in the art could adjust the current limit in a similar range to prevent pitting damage.

Any remaining/residual polymer 8 is physically removed as the remaining polymer 8 burns or is ejected by the energetic release caused by mild arcing from the holder 2 to the reactor plate 1. The voltage potential is not meant to be a limitation as one skilled in the art could apply less voltage with higher amperage or apply higher voltage with less amperage. The upper limit of the voltage set point should take the insulation class of the conductors to the reactor holder into consideration, and is typically less than 3,000V.

The length of time the electrical circuit is closed could also be modified without changing the intention of removing the residual polymer 8. The length of time is typically in the range of about 10 seconds to about 90 seconds, for example about 10, 20, 30, 40, 50, 60, 70, 80 or 90 seconds. The hot side voltage is manually applied by an operator utilizing a hot stick and gloves rated for the intended applied voltage. The first embodiment of FIG. 1 is the embodiment exemplifying the manual application of voltage to each holder 2.

Further after an initial high voltage test, a secondary test at 2,000 V is performed as a quality check to test for leakage current to ground to ensure that the reactor plate 1 and holders 2 were sufficiently cleaned. Additional high voltage tests at 2,000 V, 1,500V and 1,000V are performed as necessary.

This process could also be automated with a different configuration shown in the second embodiment in FIG. 2. A high voltage test cable 9 is wired to each holder 2 below the reactor plate 1. All of the plurality of high voltage test cables 9 are connected to a high voltage switching component 10. The high voltage switching component 10 is computer controlled switch which can distribute and manage, according to a computer control and input, the application of high voltage to each holder 2.

The high voltage switching component 10 is connected to an automated alternating current (AC) high potential testing equipment 11. The automated AC high potential testing equipment 11 can be networked to more high voltage switching components (not shown) depending on the application and size of the reactor.

The automated AC high potential testing equipment 11 is further connected to a computer/processor 12. In the automated example of FIG. 2 a complete electrical circuit can be created from holder 2 connected to high voltage switching component 10, further connected to the automated AC high potential testing equipment 11 and finally connected to a ground connection. Once the electrical circuit is completed and current flows from the automated AC high potential testing equipment 11 to the ground connection, any remaining polymer 8 is physically removed as the polymer 8 burns or is ejected by the energetic release caused by mild arcing from the holder 2 to the reactor plate 1.

The application amounts of voltage and current in the second embodiment can be similar to the first embodiment. For example, the automated AC high potential testing equipment 11 is set in the range of about 5 to 30 milliamperes and about 1,500 to 4,000 volts. The high potential test equipment can be set at about 5, 10, 15, 20, 15 or 30 milliamperes and about 1,500; 2,000; 2,500; 3,000; 3,500; or 4,000 volts. For example the automated AC high potential testing equipment 11 can be set to 15 milliamperes and 2,500 volts. However with the process control, the timing and duration of time of the application of the voltage and current can be more precisely controlled. The automated method can be more time/cost efficient in terms of time and voltage/current applied.

This process for preventing grounding presents a novel method for preventing reactor groundings by eliminating residual polymer 8 from difficult to clean areas by applying a high potential current across the rod holder 2 and reactor plate 1 thereby eliminating the residual polymer 8 by combustion or by ejection from a mild arc. The method does not introduce contamination to the reactor system after cleaning which is a necessary design criterion for high purity polysilicon reactors.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A process to prevent grounding from a silicon rod to a reactor plate in a polycrystalline reactor comprising:
   providing the polycrystalline silicon reactor having the reactor plate with a plurality of silicon rod holders each separated from the reactor plate with an insulation;
   establishing an electrical circuit from a ground connection on the reactor plate connected to a potential test equipment further connected to a voltage probe; and
   completing the electrical circuit by contacting the high voltage probe to one rod holder of the plurality of rod holders;
   wherein any remaining polymer in the polycrystalline silicon reactor deposited completely or partially on the one rod holder or the one rod holder insulation is physically removed as the remaining polymer burns or is ejected by an energetic release caused by arcing from the rod holder to the reactor plate.

2. The process according to claim 1 further comprising setting the potential test equipment in the range of about 5 to 30 milliamperes and about 1,500 to 4,000 volts for delivery of a set amount of milliamperes and volts to the one rod holder.

3. The process according to claim 1 further comprising setting the potential test equipment at about 15 milliamperes and about 2,500 volts for delivery of a set amount of milliamperes and volts to the one rod holder.

4. The process according to claim 3 further comprising completing the electrical circuit on each rod holder of the plurality of rod holders for about 10 seconds to about 90 seconds.

5. The process according to claim 3 further comprising completing the electrical circuit on each rod holder of the plurality of rod holders for about 30 seconds.

* * * * *